(12) United States Patent
Chee et al.

(10) Patent No.: US 6,369,665 B1
(45) Date of Patent: Apr. 9, 2002

(54) MAINTAINING CONSTANT AMOUNT OF SLOPE COMPENSATION REGARDLESS OF SWITCHING FREQUENCY DURING SYNCHRONIZATION

(75) Inventors: San Hwa Chee, Fremont; Stephen W. Hobrecht, Los Altos; Randy Flatness, Los Gatos, all of CA (US)

(73) Assignee: Linear Technology Corporation, Milipitas, CA (US)

( * ) Notice: Subject to any disclaimer, the term of this patent is extended or adjusted under 35 U.S.C. 154(b) by 0 days.

(21) Appl. No.: 09/677,158

(22) Filed: Oct. 2, 2000

(51) Int. Cl.$^7$ ................................................. H02K 3/02
(52) U.S. Cl. ........................ 331/143; 331/153; 331/175
(58) Field of Search ................................ 331/111, 143, 331/153, 172, 173, 175

(56) References Cited

U.S. PATENT DOCUMENTS 5,990,753 A * 11/1999 Danstrom et al. .......... 331/143

* cited by examiner

Primary Examiner—David Mis
(74) Attorney, Agent, or Firm—Fish & Neave; Joel Weiss

(57) ABSTRACT

An oscillator circuit that adjusts the oscillation voltage such that the voltage oscillates in a uniform manner independent of changes to frequency. Slope compensation is derived from the oscillation voltage. The adjustment is implemented by using a window comparator to establish a range of operation of the oscillation voltage. When the oscillation voltage is outside the range of operation, the window comparator instructs a counter circuit to either count up or count down, depending on the value of the oscillation voltage relative to the range. This counting then is used to adjust the amount of current which charges the capacitor. Thus, when the peak voltage is too low, the amount of current is adjusted upward. When the peak voltage is too high, the amount of current is adjusted downward. In this fashion, the oscillation voltage is maintained at a substantially uniform value, while the frequency is synchronized to an external clock signal.

18 Claims, 5 Drawing Sheets

MAINTAINING CONSTANT AMOUNT OF SLOPE COMPENSATION REGARDLESS OF SWITCHING FREQUENCY DURING SYNCHRONIZATION

BACKGROUND OF THE INVENTION

The present invention relates to switching regulator circuits. More particularly, the present invention relates to circuits and methods for maintaining constant amounts of slope compensation in switching regulators regardless of switching frequency of the regulators.

The purpose of a voltage regulator is to provide a predetermined and substantially constant output voltage to a load from a voltage source which may be poorly-specified or fluctuating. Two types of regulators are commonly used to provide this function; a linear regulator and a switching regulator. In a typical linear regulator, the output voltage is regulated by controlling the flow of current through a pass element from the voltage source to the load.

In switching voltage regulators, however, the flow of current from the voltage source to the load is not steady, but is rather in the form of discrete current pulses. To create the discrete current pulses, switching regulators usually employ a switch (such as a power transistor) that is coupled either in series or parallel with the load. The current pulses are then converted into a steady load current with an inductive storage element.

By controlling the duty cycle of this switch—i.e., the percentage of time that the switch is ON relative to the total period of the switching cycle—the switching voltage regulator can regulate the load voltage. In current-mode switching voltage regulators—i.e., a switching regulator that is controlled by a current-derived signal in the regulator—there is an inherent instability when the duty cycle exceeds 50%)—i.e., when the switch is ON for more than 50% of a given switching period. Stability is often maintained in such current-mode switching regulators by adjusting the current-derived signal used to control the regulator with a slope compensation signal which compensates for the instability present at higher duty cycles.

One method of producing such a slope compensation signal is to use a portion of an oscillator signal as the compensation signal. The oscillator signal may be, for example, a ramp signal that is used to generate a clock signal that controls the switching of the regulator. The slope compensation signal can be applied by either adding the ramp signal to the current derived signal, or by subtracting it from a control signal. By deriving the slope compensation signal from a signal that oscillates the switch of the regulator, the slope compensation signal is advantageously synchronized with the switching of the regulator.

FIG. 1 shows an oscillator circuit 100 that may be used to set the switching frequency and to generate slope compensation.

FIG. 2 is a timing diagram which illustrates the operation of the circuit in FIG. 1. FIG. 2 indicates that the oscillator controls the switching frequency of the switching regulator as follows: The oscillator controls the frequency of the switching regulator by charging capacitor 110 to a reference voltage through a controllable current source 120. The voltage of capacitor 110 is shown as the voltage at node A at line 1 of FIG. 2.

The voltage on capacitor 110 provides a dynamic indication of the duty cycle of circuit 100. For example, when the voltage is 0V, circuit 100 is at the beginning of its duty cycle and when the voltage on the capacitor is at $V_{REF}$, circuit 100 is near the end of its duty cycle. This is important to slope compensation because duty cycle information is crucial to providing the proper amount of slope compensation. Thus, the voltage on capacitor 110 can be used to govern the amount of slope compensation.

This voltage at node A causes comparator 130 to trip when the capacitor voltage rise to $V_{REF}$. The output of comparator 130, which provides the output signal to the control logic of the switching regulator, to node A is shown at line 3 of FIG. 2. When comparator 130 trips, this commences the ON-portion of the duty cycle of the switching regulator. When latch 140 changes its output such that switch 150 closes, capacitor 110 discharges rapidly. Line 2 in FIG. 2, indicated by $\phi_A$ in FIGS. 1 and 2, shows the activity of the output of latch 140. When the voltage at node A falls to $V_{R2}$ level, comparator 160 trips. This resets latch 140 and switch 150 turns OFF. At this point, capacitor 110 begins to charge and the cycle is repeated.

FIG. 3 is a circuit 300 which utilizes the capacitor 110's voltage to generate slope compensation current. Resistor string 310, 320, 330 and 340 sets the different points in the duty cycle at which the rate of change in scope compensation is determined.

FIG. 4 shows three break points at which resistor string 310–340 obtains different levels of slope compensation. The first break point is normally set at about 40% duty cycle (preferably below 50% duty cycle). Transistor 350 typically turns on at the first break point. Transistor 360 typically turns on at the second break point and adds more current to the slope compensation signal. Transistor 370 typically turns on at the third break point and adds even more current. Resistors 372, 374 and 376 are required for operation of the circuit.

In particular implementations, such as communications circuitry, it is advantageous to synchronize the operation of the regulator to a higher frequency by using an external clock. One way to force the regulator to a higher frequency is by forcing the oscillator's capacitor to discharge prematurely. However, by doing that, the circuit loses crucial duty cycle information. Without proper duty cycle information, insufficient slope compensation can result.

One possible solution for this problem is solved by adding circuitry to detect the presence of an external clock. Once the external clock is detected, the slope compensation is then increased by a fixed factor to account for the maximum synchronizable frequency. One problem with this approach is that if the regulator is synchronized just slightly above the normal operating frequency, overcompensation results. The result of this compensation causes the maximum output current to be reduced by the amount of the overcompensation.

Another approach to synchronize without reducing the effectiveness of the slope compensation is to implement a phase lock loop (PLL) together with the regulator on the chip. The PLL ensures the voltage on the oscillator's capacitor always reaches the trip voltage as long as the external clock is within its capture range—i.e., the range in which the PLL can track the frequency. Thus, the duty cycle information on the oscillator capacitor is retained. However, this approach requires an additional pin on the chip because the PLL loop filter components are typically too large to implement on the chip.

Therefore, it would be desirable to provide a circuit that maintains slope compensation while synchronizing the operation of the regulator to an external clock frequency.

It would also be desirable to provide a circuit that maintain slope compensation over substantially the entire range of operation of the regulator.

It would also be desirable to provide an integrated circuit that maintains slope compensation with a minimum of additional circuitry.

SUMMARY OF THE INVENTION

It is therefore an object of the present invention to provide a circuit that maintains slope compensation while synchronizing the operation of the regulator to an external clock frequency.

It is another an object of the present invention to provide a circuit that maintains slope compensation over substantially the entire range of operation of the regulator.

It is a further an object of the present invention to provide an integrated circuit that maintains slope compensation with a minimum of additional circuitry.

These and other objects of the present invention are accomplished by providing an oscillator circuit that includes a capacitor that provides a first voltage, a window comparator circuit coupled to the capacitor that provides a first output signal and a second output signal based on the first voltage, a counter circuit that provides a control signal based on the first output signal and the second output signal and a controllable current source that controls the first voltage based on the control signal.

A preferable method according to the invention of synchronizing a oscillating capacitor to an external clock frequency while substantially maintaining a constant peak voltage of the oscillating capacitor includes charging and discharging a capacitor at the external clock frequency, comparing the peak to a first reference voltage to provide a first output signal, comparing the peak to a second reference voltage to provide a second output signal, producing a control signal by one of a group consisting of 1) counting up, 2) counting down, and 3) remaining the same, based on the first and second output signals, and adjusting the peak based on the control signal.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 5:
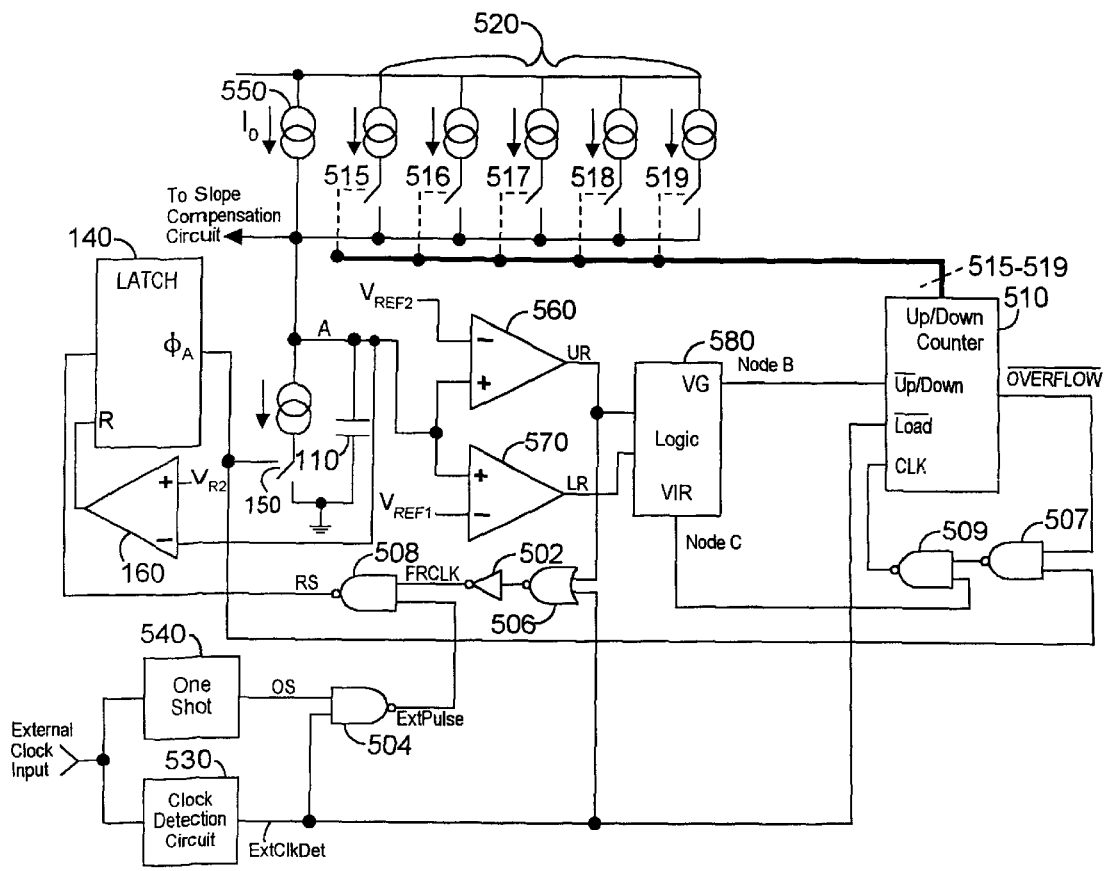
FIG. 5 is a block diagram of a slope compensation synchronization circuit according to the invention.

FIG. 5 shows a block diagram of a circuit 500 according to the invention that preferably includes the attributes of the PLL but does not require the additional discrete circuitry and additional pin required by a PLL. In circuit 500, the voltage at node A is made to maintain substantially the same peak voltage regardless of the switching frequency, as long as the frequency is within the specified range of the circuit, as will be explained.

Circuit 500 operates to maintain the voltage level of oscillator capacitor 110 independent of switching frequency. In broad terms, the circuit operates generally as follows. When circuit 500 is synchronized to an external clock, circuit 500 returns the peak voltage level to a pre-determined range within a few clock cycles. Circuit 500 preferably accomplishes this by adjusting the current used to charge capacitor 110. It adjusts the current by using a counter circuit 510. The counter circuit bie receives its adjusting information from a window comparator including comparators 560 and 510.

During each of the first few counting cycles, up/down counter 510 counts either up or down depending on whether the external clock is faster (up/sync) or slower (down sync) than the present operating frequency. Each of current sources 520 are configured to supply a portion of current to node A. Current sources 520 may preferably be binarily weighted in order to provide an incrementally adjustable current source—i.e., a current source that can be adjusted either up or down in known discrete amounts. This current affects the voltage at node A. As the counter counts up or down, current sources 520 are either added or removed until node A is charged to a peak voltage within a pre-determined voltage range. Once the voltage is in the pre-determined range, the control signal (which may be alternatively referred to as a counter signal) from up/down counter 510 does not count up or down, but, rather, remains the same. At this point, the circuit is synchronized with the external clock frequency.

It should be noted that the clock of up/down counter 510 is preferably set by the output of latch 140. This output preferably substantially simultaneously also sets the time for capacitor 110 to discharge. Furthermore, this output also fixes the time when the circuit uses the comparison of $V_A$ to reference voltages $V_{REF1}$ and $V_{REF2}$ by the comparators. Therefore, counting may preferably occur when capacitor 110 is at about its peak voltage. This forces the comparison to occur at the maximum capacitor voltage. In another embodiment, counter 510 may perform the counting function at a time during the clock cycle other than when the capacitor 110 is at its peak voltage.

A detailed explanation of the operation of circuit 500 follows. Circuit 500 operates in three different modes: free-running mode, up-synchronization and down-synchronization. The modes are differentiated by the different clock signals that are applied to the circuit. In free-running mode, no external clock is applied to the synchronization pin. Up-synchronization, begins when a clock signal that is of a higher frequency than the present operating signal is detected. In down-synchronization, a clock signal that is of a lower frequency than the present operating signal is detected.

To determine whether an external clock has been applied or whether a one-time state change is occurring at the synchronization pin, clock detection circuit 530 is used. This determination is important when the synchronization pin serves multiple functions. An example of a three state function of the synchronization pin is: a low voltage on this pin causes the chip to perform a certain function, a high voltage causes the chip to perform another function and a clock signal applied to this pin indicates that synchronization is required. In one embodiment, clock detection circuit 530 outputs a logic high when an external clock is applied, and a logic low when no external clock is applied.

When an external clock has been applied, as in up-synchronization, down-synchronization or locked mode—i.e., the mode wherein the circuit has been synchronized to the external signal—one-shot circuit 540 receives the external clock signal and generates an output consisting of a narrow pulse with substantially the same period as the external clock signal. When there is no external clock signal, the output of one-shot 540 will either be a logic low or a logic high, preferably depending on the state of the synchronization pin.

Figure 1:
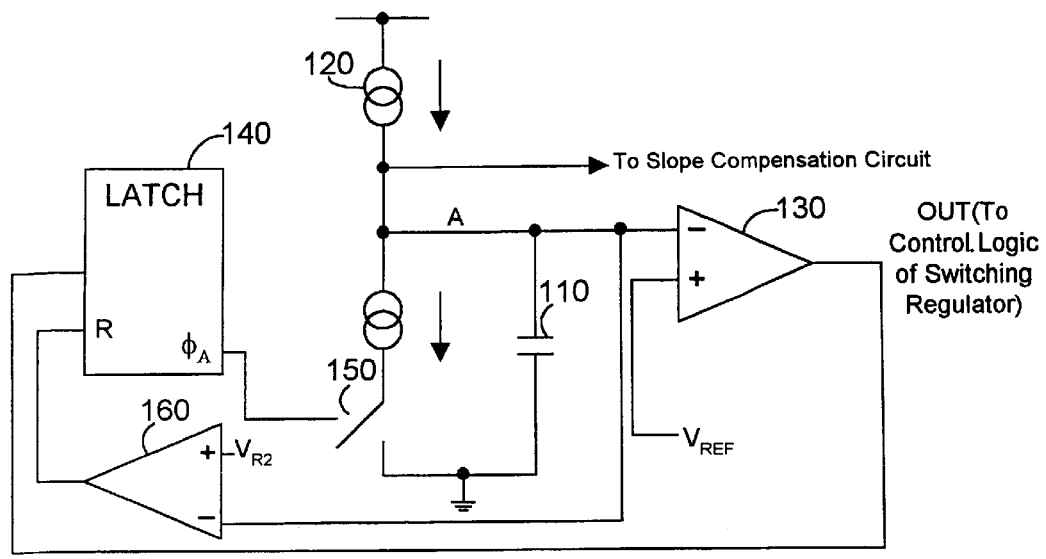
FIG. 1 is a schematic diagram of a prior art oscillator circuit used to switch a switching regulator.
Figure 2:
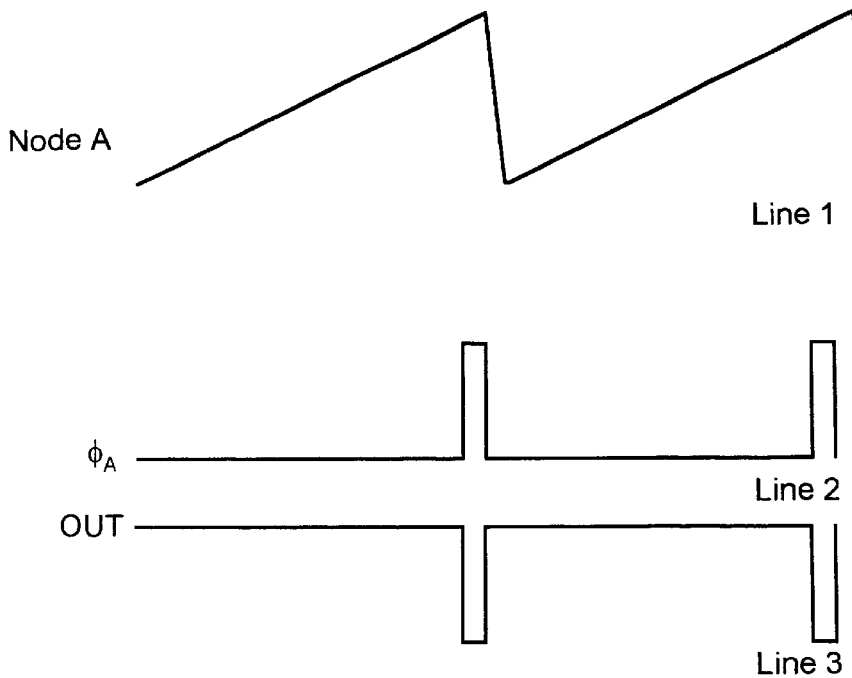
FIG. 2 is a graphical illustration of the various outputs of the circuit in FIG. 1.
Figure 3:
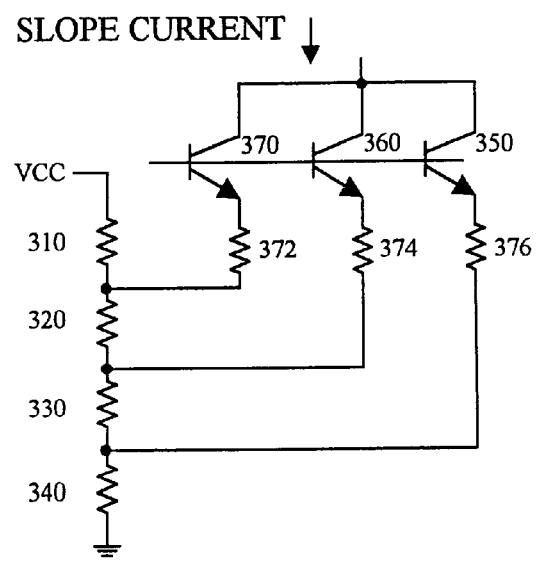
FIG. 3 a circuit diagram of a conventional circuit for providing different levels of slope compensation.
Figure 4:
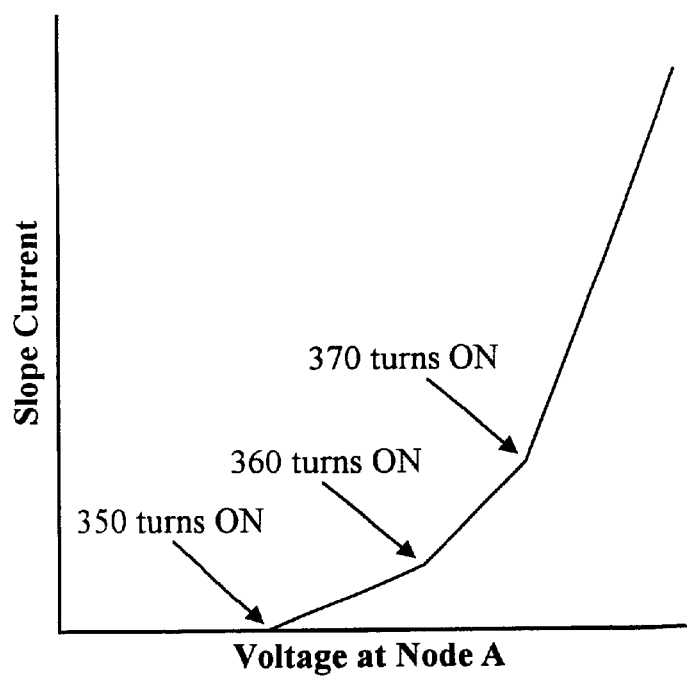
FIG. 4 is a graphical illustration of the operation of the circuit in FIG. 3.

In free-running mode, the oscillator frequency is governed by a signal loop which includes the voltage at node A and signals UR, FRCLK and RS. In this mode, circuit 500 operates substantially identically to oscillator circuit 100 shown in FIG. 1. The ExtClkDet (External Clock Detection) signal preferably remains at logic low during free-running mode and this preferably causes up/down counter 510 to load a preset value at the load input of counter 510. This value may turn one or more of current sources 520 ON using connection lines 515–519, which add current to the supply provided by current source 550. The total current provides the charging current of the oscillator capacitor 110 and defines the charging rate to capacitor 110, thereby setting the free-running frequency.

Up-synchronization begins when the external clock frequency is higher than the present operating frequency. When an external clock is applied, the above-mentioned loop is broken by the ExtClkDet signal going high. The control of the operation of the signals to latch 140 is preferably implemented through logic elements 502, 504, 506 and 508. At this point, the discharging of the oscillator's capacitor is controlled by the output of one-shot circuit 540 through signal OS. Also, clock detection circuit 530 ceases to instruct up/down counter 510 to load a preset value. Furthermore, one-shot circuit 540 preferably operates with the same frequency as the external clock.

During the first few cycles of the up synchronization, voltage at node A will be terminated prematurely and, therefore, will not rise to the voltage window established by the reference voltages $V_{REF1}$ and $V_{REF2}$ of comparators 560 and 570. At this point, the signal at node B, which represents $V_A > V_{REF2}$ preferably is low, causing up/down counter 510 to count up. With each count up, counter 510 preferably turns ON one or more additional current sources from sources 520 to more quickly charge the oscillator's capacitor 110. Thus, it is shown that comparators 560 and 570 use reference voltages $V_{REF1}$ and $V_{REF2}$ to form a window comparator which establishes a specific range of operation for oscillator capacitor 110. Furthermore, logic circuit 580 is used to process the output of comparators 560 and 570 and to provide the information from the comparators to up/down counter 510.

This process repeats at every clock cycle until the voltage at node A rises to within the voltage range determined by reference voltages $V_{REF1}$ and $V_{REF2}$. When this happens, node C, which represents $V_{REF1} < V_A < V_{REF2}$, goes low, stopping counter 510 from counting. Circuit 500 is now synchronized to the external clock frequency.

As described above, the clock of the up/down counter preferably is governed by the operation of latch 140. It is also controlled in part by the overflow from counter 510 (overflow prevents the counter from "hunting"—i.e., searching for a proper voltage level—when the input frequency is higher than the capture range), node C output and logic elements 507 and 509.

Figure 6:
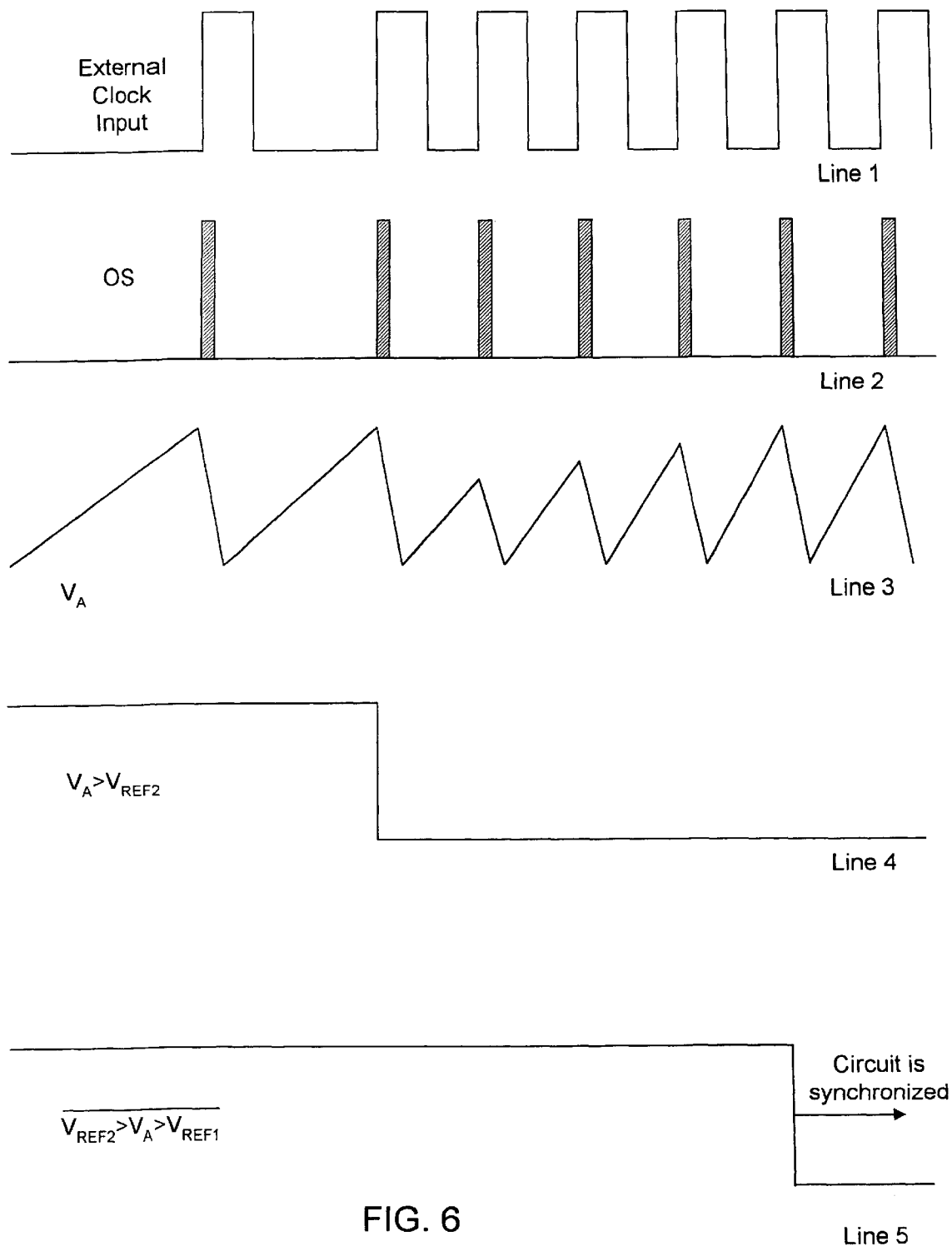
FIG. 6 is a timing diagram, according to the invention, of the operation of the circuit in FIG. 5.

FIG. 6 shows the graphical representation of the up-synchronization of circuit 500 to the external cock signal from a lower frequency. Line 1 shows the external clock input. Line 2 shows the one-shot signal, OS. The one-shot signal is a narrow pulse that preferably has the same period as the external clock signal. Line 3 shows voltage at node A. At the first few clock pulses at a higher frequency, it can be seen that the voltage at node A drops before it ever reaches the full level required for proper operation of the circuit and sufficient slope compensation. After the first few pulses, it can be seen that the peak voltage has returned to its original level, albeit at a different frequency.

Line 4 shows the voltage at node B, which corresponds to $V_A > V_{REF2}$. When this voltage goes low, the up-synchronization provided by counter 510 commences. The voltage at node B goes low at substantially the same time the external clock input is applied. This results because the OS signal takes almost immediate control of discharging capacitor 110 with the same frequency of the external clock input.

Line 5 shows that when node C, which preferably represents the inverse of the term $V_{REF2} > V_A > V_{REF1}$, goes low, circuit 500 is fully synchronized to the external clock signal. This state locks counter 510 at its present position. This state also allows circuit 500 to charge capacitor 110 to its correct value, and to maintain adequate slope compensation at the higher frequency.

Figure 7:
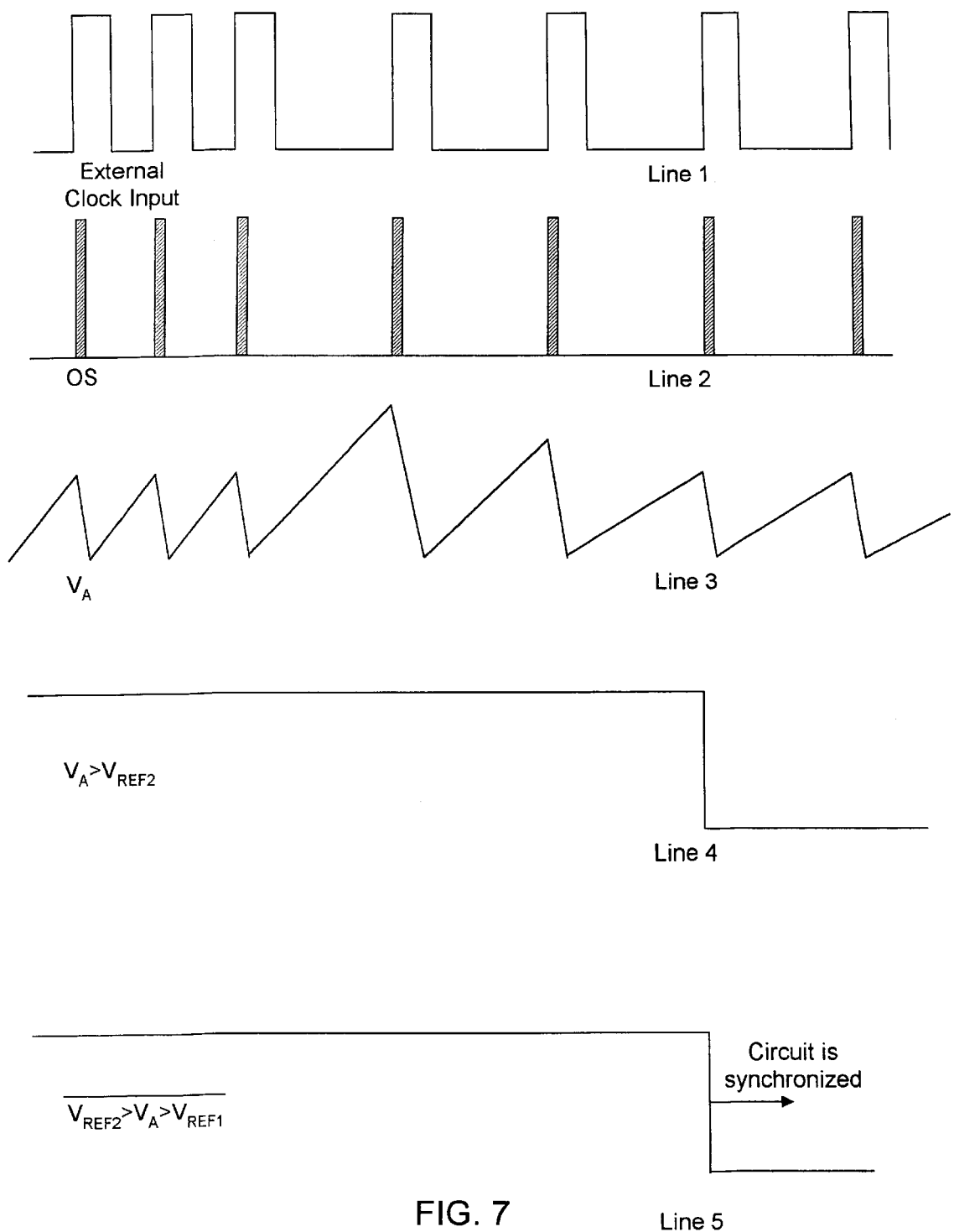
FIG. 7 is another timing diagram, according to the invention, of the operation of the circuit in FIG. 5.

FIG. 7 shows the operation of circuit 500 in the down-synchronization mode. Down-synchronization works similarly to the up-synchronization except some of the signals are in the opposite state. Line 1 shows the external clock input as its frequency decreases. Line 2 shows the one-shot signal, OS, which substantially tracks the external clock input.

Line 3 shows the voltage at node A. When the external clock frequency decreases, this voltage charges up to a higher voltage then the voltage it is charged to before the frequency decrease. This higher voltage causes node B to go high. When node B goes high, counter 510 counts down and may shut OFF one current source from current sources 520 at each clock cycle. Once the voltage at node A falls within the voltage range established by the reference voltages of comparators 560 and 570, no down counting signals are received by counter 510. Rather, a remain-the-same signal is received by counter 510. Thereafter, counter 510 fixes the production of charging current to capacitor 110.

Node B and node C are shown in lines 4 and 5. When the circuit is synchronized, each of the nodes go low.

It should be noted that each reference to the high voltages and low voltages with respect to the comparators does not limit this invention to any particular arrangement of comparator output voltages or input voltages. Rather, the embodiment shown in FIG. 5, and described in the corresponding portion of the specification, is only meant to illustrate the operation of the invention and not to limit the invention to a specific HIGH or LOW output configuration.

Persons skilled in the art will appreciate that the principles of the present invention can be practiced by other than the described embodiments, which are presented for purposes of illustration and not of limitation, and the present invention is limited only by the claims which follow.

What is claimed is:

1. An oscillator circuit comprising:
   a capacitor that provides a first oscillating voltage;
   a window comparator circuit coupled to the capacitor and that provides a first output signal and a second output signal based on the first oscillating voltage;
   a counter circuit that provides a counter signal based on the first output signal and the second output signal; and
   a controllable current source that controls the first voltage based on the control signal.

2. The oscillator circuit of claim 1 wherein the controllable current source controls the amplitude of the first voltage based on the control signal.

3. The oscillator circuit of claim 1 wherein the first voltage is an oscillating voltage with a substantially constant peak amplitude.

4. The oscillator circuit of claim 1 wherein the first voltage is an oscillating voltage.

5. The oscillator circuit of claim 1 wherein the first voltage oscillates with an adjustable period.

6. The oscillator circuit of claim 1 wherein the window comparator circuit comprises a first comparator having a first reference voltage and a second comparator having a second reference voltage wherein the window comparator circuit provides a range of peak operation of the first voltage between the first reference voltage and the second reference voltage.

7. The oscillator circuit of claim 1 wherein the controllable current source is incrementally controllable.

8. The oscillator circuit of claim 1 further comprising a logic circuit that receives the first output signal and the second output signal, and that instructs the counter circuit to perform one of a group consisting of counting up, counting down, remaining the same based on the first output signal and the second output signal.

9. An oscillator circuit comprising:
   a capacitor that provides an oscillating voltage having a peak voltage and a varying period;
   a window comparator circuit that provides a target range of operation for the peak voltage between a first reference voltage and a second reference voltage, and that provides a first output signal and a second output signal based on the peak;
   a counter circuit that receives the first output signal and the second output signal, and that provides a control signal based on the first output signal and the second output signal; and
   an adjustable current source that sets the peak voltage of the oscillating voltage based on the on the signal independently of the varying period.

10. The oscillator circuit of claim 9 wherein the window comparator circuit comprises a first comparator that provides the first output voltage and a second comparator that provides the second output voltage.

11. The oscillator circuit of claim 9 wherein the controllable current source is incrementally controllable.

12. The oscillator circuit of claim 9 further comprising a logic circuit that receives the first output signal and the second output signal, and that instructs the counter circuit to perform one of a group consisting of counting up, counting down and remaining the same based on the first output signal and the second output signal.

13. The oscillator circuit of claim 9 wherein the oscillator circuit maintains the peak voltage at a substantially constant voltage.

14. A method of synchronizing an oscillating capacitor to an external clock frequency while maintaining a substantially constant peak voltage of the oscillating capacitor, the method comprising:
   charging and discharging a capacitor at the external clock frequency;
   comparing the peak to a first reference voltage to provide a first output signal;
   comparing the peak to a second reference voltage to provide a second output signal;
   producing a control signal by one of a group consisting of 1) counting up, 2) counting down, and 3) remaining the same, based on the first and second output signals; and
   adjusting the peak voltage based on the control signal.

15. The method of claim 14 the adjusting further comprising maintaining the peak voltage between the first reference voltage and the second reference voltage.

16. The method of claim 14 the adjusting further comprising adjusting an amount of current used to charge the capacitor in order to maintain the peak between the first reference voltage and the second reference voltage.

17. The method of claim 14 the adjusting further comprising incrementally adjusting the peak.

18. The method of claim 14 the comparing the peak to a first reference voltage to provide a first output signal and the comparing the peak to a second reference voltage to provide a second output signal further comprising comparing using a window comparator to provide the first output signal and the second output signal.

* * * * *